US007810010B1

United States Patent
Lawrie

(10) Patent No.: US 7,810,010 B1
(45) Date of Patent: Oct. 5, 2010

(54) DECODER FOR A TURBO CODE

(75) Inventor: David I. Lawrie, Heriot (GB)

(73) Assignee: Xilinx, Inc., San Jose, CA (US)

( * ) Notice: Subject to any disclaimer, the term of this patent is extended or adjusted under 35 U.S.C. 154(b) by 1169 days.

(21) Appl. No.: 11/439,667

(22) Filed: May 24, 2006

(51) Int. Cl.
*H03M 13/00* (2006.01)

(52) U.S. Cl. ...................................... 714/755

(58) Field of Classification Search ................. 714/755
See application file for complete search history.

(56) References Cited

U.S. PATENT DOCUMENTS 7,607,072 B2 * 10/2009 Ashley et al. ............... 714/792
2005/0278603 A1 * 12/2005 Berens et al. ............... 714/755

OTHER PUBLICATIONS

U.S. Appl. No. 10/291,441, filed Nov. 8, 2002, Hemphill et al.
U.S. Appl. No. 10/717,042, filed Nov. 18, 2003, Wilkie et al.
Vogt, J. et al., "Improving the max-log-MAP turbo decoder", Electronics Letters, Nov. 9, 2000, pp. 1937-1939, vol. 36, No. 23, available from IEEE, 3 Park Avenue, 17th Floor, New York, NY 10016-5997.
Xilinx, Inc., "3GPP Turbo Decoder", DS318, Nov. 11, 2004, Product Specification, pp. 1-24, available from Xilinx, Inc., 2100 Logic Drive, San Jose, CA 95124.
Xilinx, Inc., "3GPP2 Turbo Decoder", DS275, Dec. 11, 20043 Product Specification, pp. 1-13, available from Xilinx, Inc., 2100 Logic Drive, San Jose, CA 95124.

* cited by examiner

*Primary Examiner*—Scott T Baderman
*Assistant Examiner*—Enam Ahmed
(74) *Attorney, Agent, or Firm*—W. Eric Webostad; John J. King; Thomas George

(57) ABSTRACT

A Turbo Code decoder for implementation in an integrated circuit is described. An add-compare select ("ACS") unit is configured to provide a difference between first and second outputs and to select one of the first and second outputs responsive to a difference thereof. An initialization stage is coupled to receive and configured to store for example the first output selected as an initialization value. A second select stage is coupled to receive for example the first output selected from the first select stage and coupled to obtain the initialization value stored from the initialization stage. The second select stage is configured to output either the first output selected from the ACS unit or the initialization value from the initialization stage.

19 Claims, 10 Drawing Sheets

DECODER FOR A TURBO CODE

FIELD OF THE INVENTION

One or more aspects of the invention relate generally to integrated circuits and, more particularly, to a decoder for implementation in an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include these exemplary devices, as well as encompass other devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

There are many known forms of error-correction codes. One known type of error-correction code is a Turbo Code. Turbo Codes use convolutional encoding. Turbo Codes are becoming more popular owing to their ability for forward error correction. However, effective forward error correction comes at a price of computational complexity. A bottleneck of this computational complexity generally occurs at a conventional Add-Compare-Select-Offset ("ACSO") unit or a conventional Add-Compare-Select ("ACS") unit of a Turbo Code decoder. Thus, the conventional ACSO or ACS unit may be part of what is generally known as a "critical path" or "speed limiting path" of a Turbo Code decoder.

Accordingly, it would be desirable and useful to provide an improved ACSO or ACS unit to enhance the speed of operation or reduce the size of a Turbo Code decoder.

SUMMARY OF THE INVENTION

One or more aspects of the invention generally relate to integrated circuits and, more particularly, to a decoder for implementation in an integrated circuit.

An aspect of the invention is a decoder. An add stage is configured to provide outputs. A compare stage is coupled to the add stage to receive the outputs therefrom and is configured to determine a difference between a pair of the outputs. A first select stage is coupled to the compare stage and the add stage. The first select stage is configured to select a first output from the pair of the outputs from the add stage responsive to the difference from the compare stage. An initialization stage is coupled to receive the first output selected from the first select stage and is configured to store the first output as an initialization value. A second select stage is coupled to receive the first output selected from the first select stage and coupled to obtain the initialization value stored from the initialization stage. The second select stage is configured to output either the first output selected from the first select stage or the initialization value from the initialization stage as a second output. Control circuitry is coupled to the initialization stage and the second select stage and is configured to control storing the initialization value in the initialization stage and to retrieve the initialization value from the initialization stage for the second select stage. The control circuitry is further configured to cause the second select stage to select either the first output selected from the first select stage or the initialization value from the initialization stage as the second output. The initialization stage in combination with the control circuitry facilitates selection between initialization and non-initialization values for providing the second output from the second select stage.

Another aspect of the invention is another decoder. An add stage is configured to provide outputs. A compare stage is coupled to the add stage to receive the outputs therefrom and is configured to determine a difference between a pair of the outputs. Control circuitry is coupled to the compare stage to receive the difference and is configured to assert either a first write activation signal or a second write activation signal responsive to the difference. A memory is coupled to receive the outputs. A first portion of the outputs is provided to a first data input port of the memory and a second portion of the outputs is provided to a second data input port of the memory. The memory is coupled to receive the first write activation signal and the second write activation signal, the first write activation signal being associated with the first data input port, the second write activation signal being associated with the second data input port.

Yet another aspect of the invention is yet another decoder including an alpha calculation unit for a decode algorithm and a beta calculation unit for the decode algorithm. One of the alpha calculation unit and the beta calculation unit is coupled to a first buffer for reversing an order of calculation results. The alpha calculation unit and the beta calculation unit are coupled to a log likelihood ratio calculation block, wherein one of the alpha calculation unit and the beta calculation unit are coupled to the log likelihood ratio calculation block via the first buffer. Each of the alpha calculation unit and the beta calculation unit includes a plurality of decode blocks, each of the decode blocks associated with memory coupled for storing and retrieving initialization data.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
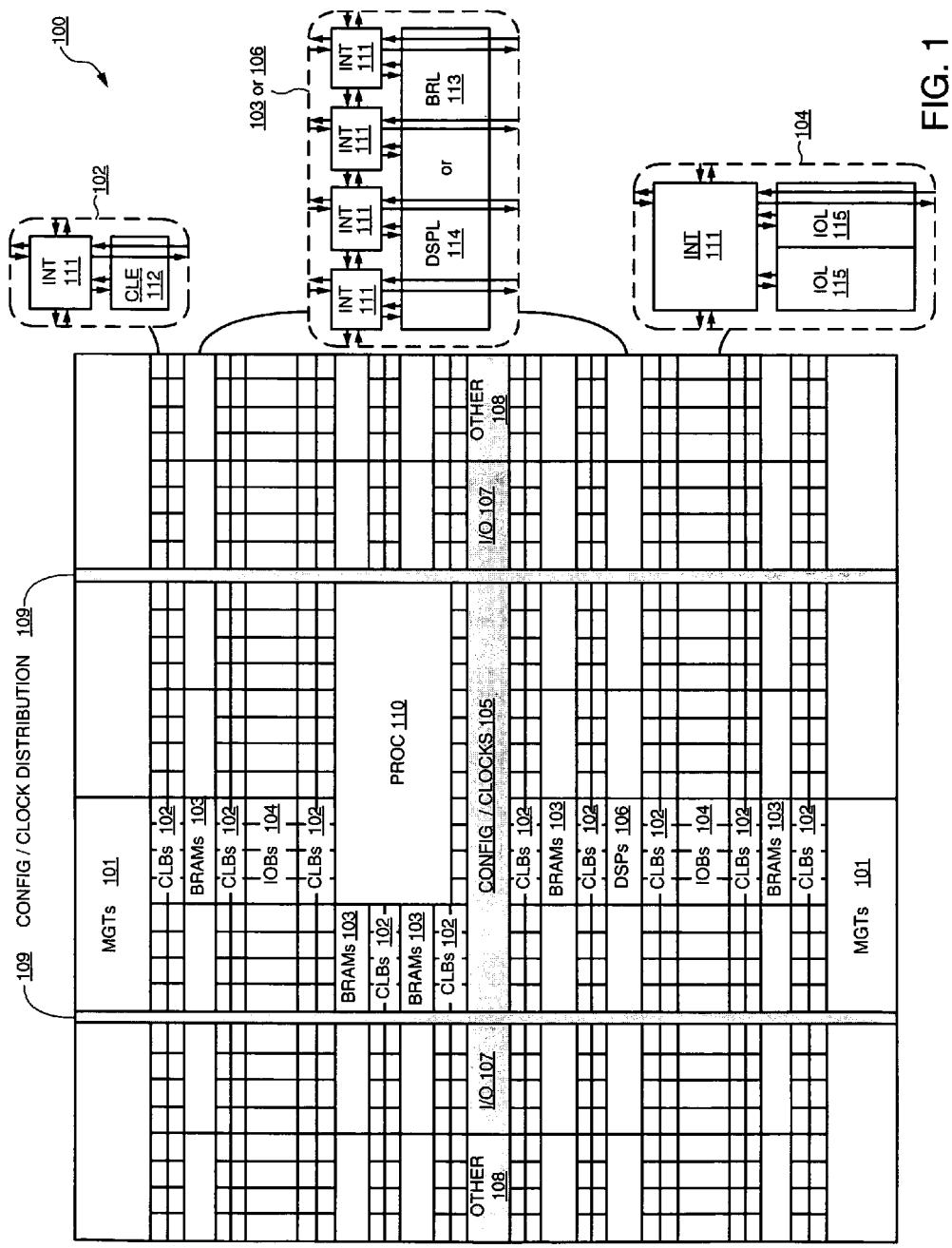
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

As is known, Turbo Code encoders and decoders are block-based, with each block containing a specified number of bits known in the art as the "block size." Such bits may be described as "block size" bits. Turbo decoders in particular implement iterative algorithms. Generally, each iteration may consist of two "Soft Input Soft Output" ("SISO") operations, where one operation uses interleaved data and the other operation uses non-interleaved data. When implemented in hardware, each SISO operation generally takes a "block-size" cycle, namely a clock cycle or cycles of a length sufficient to process a block. Accordingly, an iteration may therefore take two "block size" cycles. As is known, generally as the number of iterations increases for implementing a Turbo Code decoding algorithm, the accuracy is enhanced. Notably, Turbo Codes, which use convolutional encoding, are to be distinguished from Turbo Product Codes, which use concatenated block codes for encoding.

With reference to a 3rd Generation Partnership Project ("3GPP") implementation having eight states, a Turbo Code algorithm may be used to calculate the probability of a state for each of the eight states for each of the block size bits. Knowing state transitions and state starting points allows for the generation of a decoded bit sequence. Such state transitions are calculated in the forward direction, known as alpha calculations, and in the reverse direction, known as beta calculations. For providing a starting point for beta calculations, a known finishing state of a block size is used. Accordingly, to force the end state of a block size to a known state, extra bits, known as "tail bits," may be used at the end of the block size bits. Alternatively, some decoder implementations may use a defined algorithm to determine the starting states for the alpha and beta calculations and therefore may not use extra "tail bits".

Figure 2A:
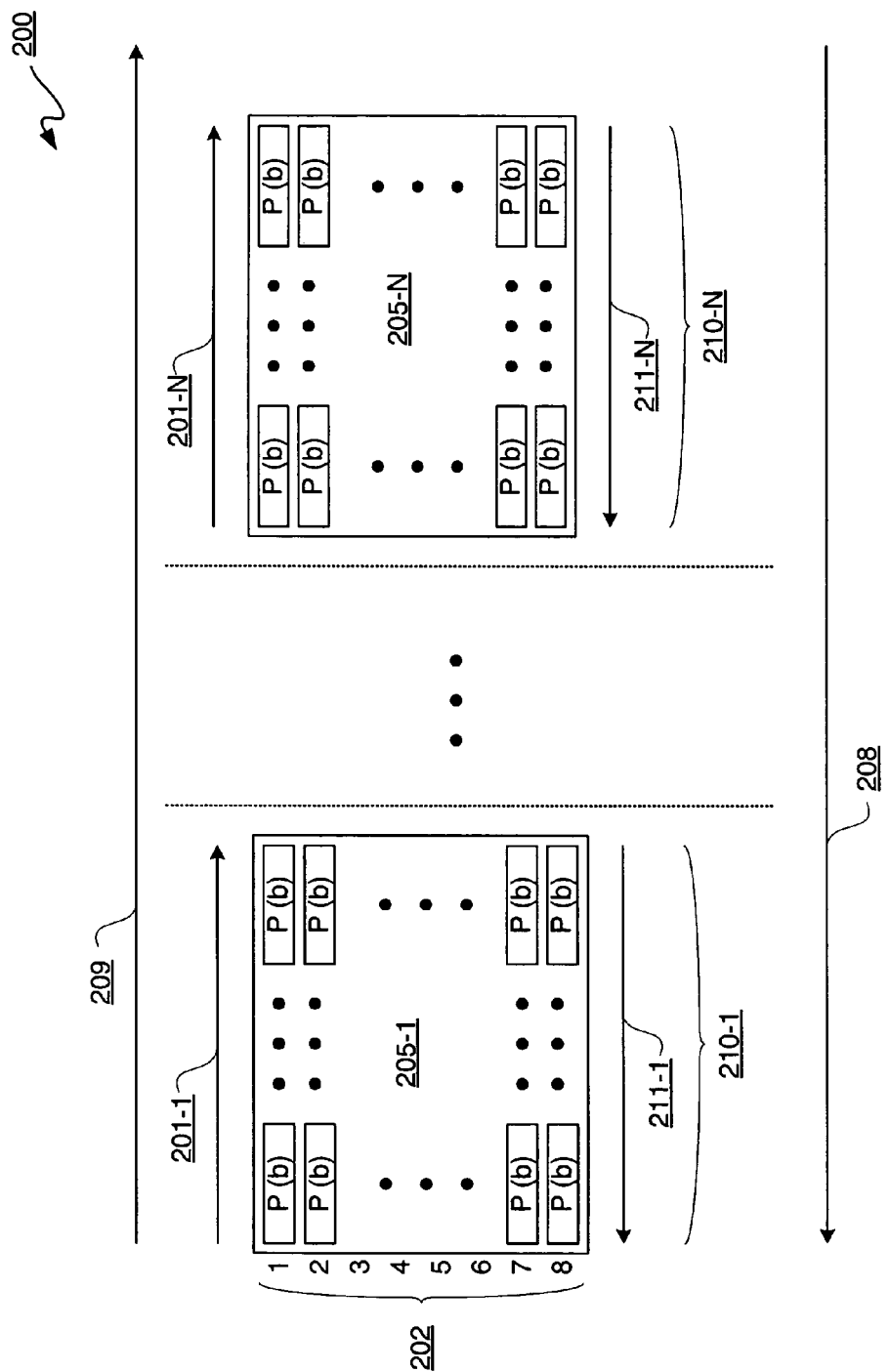
FIG. 2A is a calculation flow diagram depicting an exemplary embodiment of alpha and beta calculations of state transitions.

FIG. 2A is a calculation flow diagram depicting an exemplary embodiment of alpha and beta calculations 200. Alpha calculations, as generally indicated by arrow 209, are calculated in a forward direction, and beta calculations, as generally indicated by arrow 208, are calculated in a reverse direction. It should be appreciated that probabilities of states ("P(b)") for states 202, namely states 1 through 8 in this example, populate arrays 205-1 through 205-N for both alpha and beta calculations.

To calculate a particular state probability ("P") for a bit ("b") in array 205-1 for example, both alpha and beta state probabilities are determined for that bit location in a block. As described above, tail bits may be added the end of the block size bits.

To reduce the memory requirements for implementing a Turbo Code decoder algorithm, the algorithm may be split into smaller groupings, namely subsets of a block size, known as "windows," as generally indicated by windows 210-1 through 210-N. Thus, within each window, such as window 210-1, there is an alpha calculation, such as generally indicated by arrow 201-1, and a beta calculation, such as generally indicated by arrow 211-1 in the reverse direction of arrow 201-1. The number of windows N, for N a positive integer, may vary depending on algorithm accuracy, algorithm latency and resource requirements.

The combination of alpha and beta calculations produces a Log Likelihood Ratio ("LLR") which essentially describes the probability that a bit is either a logic zero or a logic one. By breaking up a block size into windows, alpha and beta calculations may be used to calculate LLR values for each associated window. For example, an alpha 1 calculation as indicated by arrow 201-1 and a beta 1 calculation as indicated by arrow 211-1 produce LLR values for window 210-1. Notably, states 202 are numbered 1 through 8 for the example of a 3GPP decoder. However, it should be appreciated that fewer or more than eight states may be implemented.

Alpha calculations are more straightforward than beta calculations, as the starting state is known. However, the starting state for a beta calculation, such as for example the starting state for beta calculations 211-1, is not known until the state of the end state as determined by calculation of a subsequent beta state, namely beta calculations 211-2, has been determined. In other words, because beta calculations are performed in reverse order, beta calculations 211-(N−1) rely on the completion of beta calculations 211-N for determining a starting state for beta calculations 211-(N−1). In the example below, initialization values or starting states for beta calculations may be stored between iterations for subsequent retrieval, as described below in additional detail. However, initialization values may be estimated or pre-calculated. With respect to pre-calculation of initialization values, an extra pre-calculation circuitry stage (not shown) may be added.

Figure 2B:
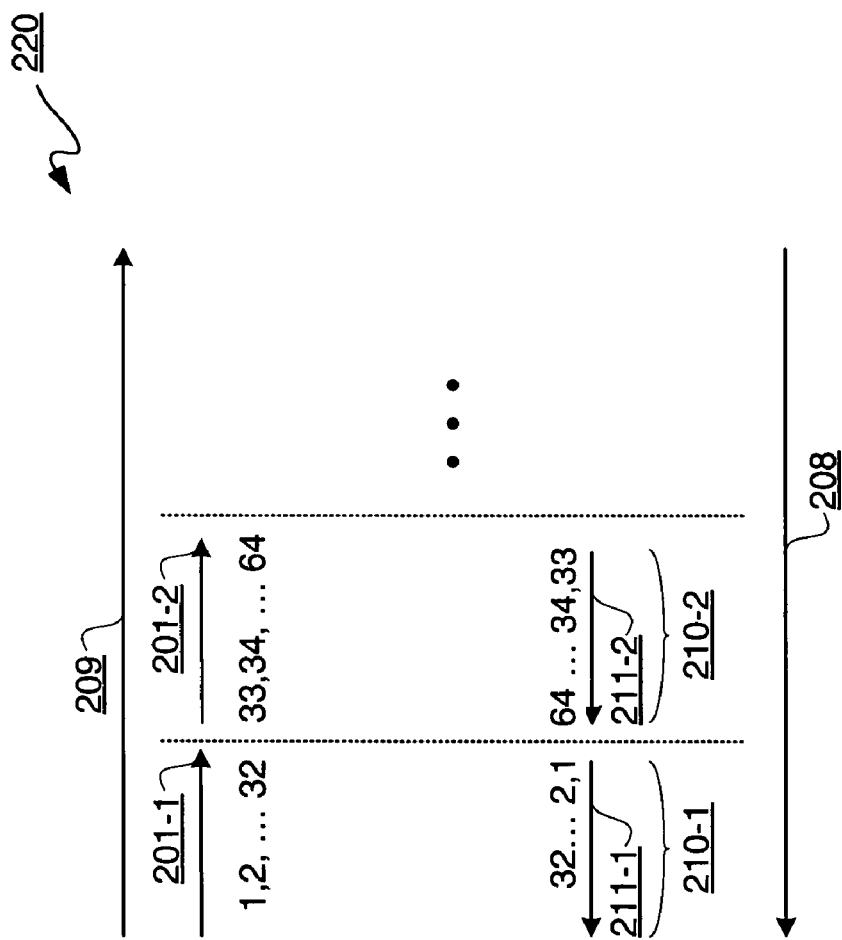
FIG. 2B is a calculation flow diagram depicting an alternative exemplary embodiment of alpha and beta calculations of state transitions, with some numerical examples.

To more clearly appreciate FIG. 2A, FIG. 2B is a calculation flow diagram depicting an exemplary embodiment of alpha and beta calculations 220 with some numerical examples. Alpha and beta calculations 220 may be for what may be considered a single alpha-beta stage implementation. Accordingly, alpha calculations 201-1 are in order, where a first bit position is calculated first followed by subsequent bits in order. The example in FIG. 2B is for a window size equal to 32 bits. Thus, if the block size were 256 bits, for example, and each window were 32 bits, then approximately eight windows, of which only windows 210-1 through 210-2 are shown for purposes of illustration, may be implemented. Notably, this is a rough estimate, as the number of tail bits that follow the data block of a block size of 256 bits may increase the block size to a number greater than 256 bits. However, for purposes of clarity and not limitation, it may be assumed that the 256 bits of the block size include tail bits. Alpha calculations 201-1, starting with the first bit position, are followed by alpha calculations 201-2, starting at the 33rd bit position in this example. In short, calculation order follows sequentially with bit position for alpha calculations.

For beta calculations within windows, beta calculations 211-1 a first calculation of a calculation order starts at bit position 32, which corresponds to bit position 32 of alpha calculations 201-1. Beta calculations 211-1 proceed in order in a reverse direction 208 with respect to alpha calculations direction 209. Thus, a 32nd calculation of a calculation order for beta calculations 211-1 is for a first bit position within window 210-1. In brief, beta calculations 211-1 proceed from bit position 32 incrementally down to bit position 1 within window 210-1. Moreover, after calculation 32 of beta calculations within window 210-1, a next set of beta calculations is started, namely beta calculations 211-2. Beta calculations 211-2 calculate from bit position 64 to bit position 33 in direction 208. Thus, it should be appreciated that beta calculations start at an extreme right within a window and are calculated in a reverse direction within the window, as compared to alpha calculations.

However, with respect to the order of sets of alpha and beta calculations, they are both done in the same direction at a window level. Thus, for example both alpha and beta calculations are initiated in window 210-1 and proceed thereafter sequentially to window 210-N in direction 209.

In this example, beta calculation accuracy may in part depend upon initialization values. Initialization values correspond to windows. Thus, for each window there is an initialization value. For example, to perform the first of beta calculations 211-1, namely the beta calculation for a bit position 32, a starting state as determined by the last calculation from window 210-2 for beta calculations 211-2 is used, namely beta calculation 64 for bit position 33. Notably, an initialization value for a first alpha calculation in this example may be to ensure a zero state, and thereafter each initialization value may be calculated as alpha calculations are sequential with bit position and with windows. However, as this value from beta calculations 211-2 has not actually been calculated at the time that beta calculations 211-1 for window 210-1 are performed, an approximation of such initialization value may be used or such initialization values may each be set to zero. With respect to approximations, results from beta calculations may be stored in memory and used for initialization values on a next use. Thus, for example, one may cycle through all beta calculations on a first iteration, and use the values obtained from such first iteration on a subsequent iteration as initialization values for the subsequent iteration. Accordingly, during the first iteration, approximate values, whether estimated or pre-calculated, for initialization for beta calculations may be used, whereas on each subsequent iteration, calculated initializations may be retrieved as stored in memory and used as initialization values for beta calculation. Notably, two sets of initialization values are stored, one set is used within with the interleaved SISO operation and the other is used within the non-interleaved SISO operation.

Thus, it should be appreciated that alpha calculations 209 conventionally progress in order in accordance with a Turbo Code decoder algorithm starting at an extreme left hand side in this example as is known. Because beta values store initialization values as described above, beta calculations may be thought of as being effectively more segmented than alpha calculations owing to windowing.

Figure 2C:
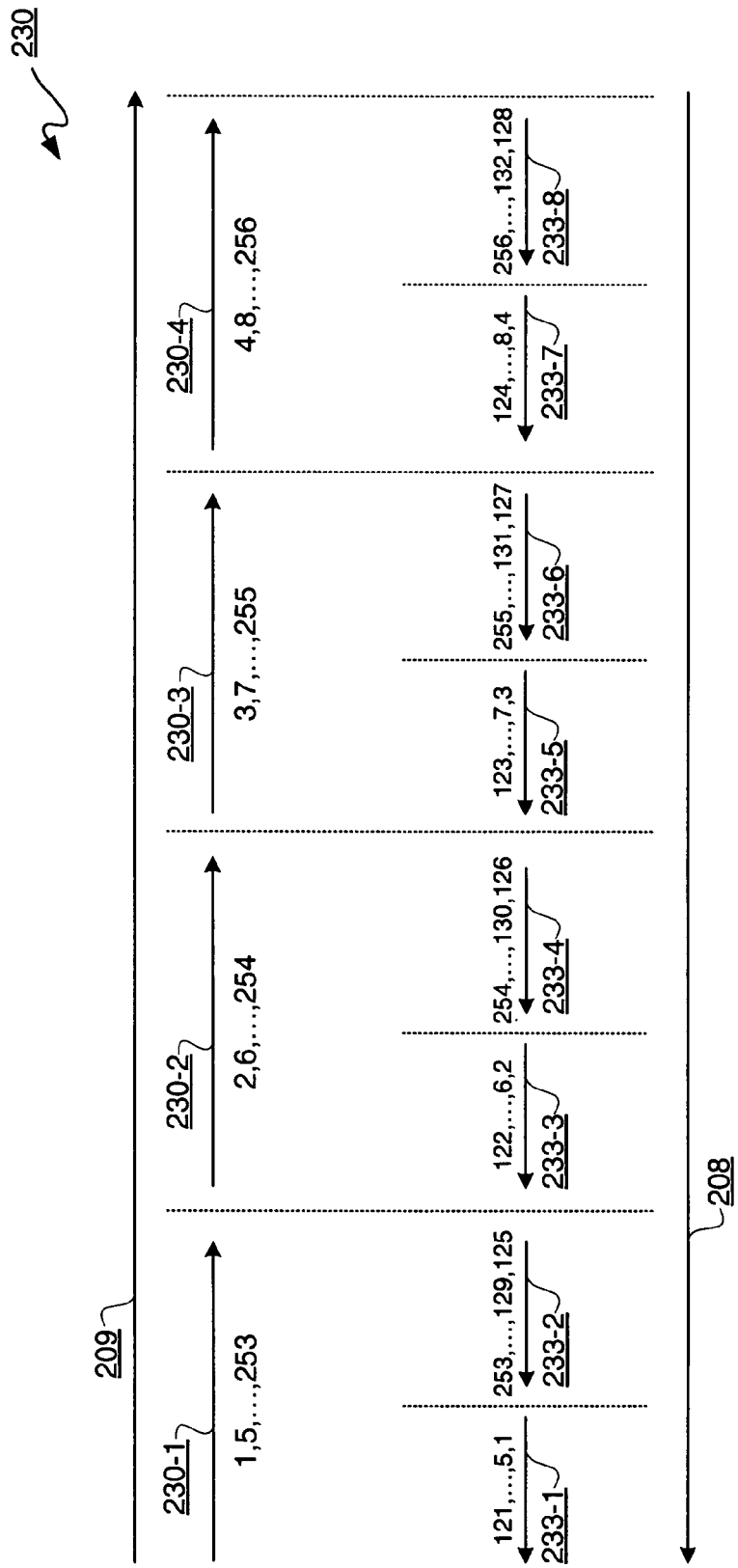
FIG. 2C is a calculation flow diagram depicting yet another exemplary embodiment of alpha and beta calculations of state transitions, where the ordering such alpha and beta calculations is divided into two or more subparts.

It should be noted that in the exemplary implementation of FIG. 2B, the first window to be calculated is 210-1 thereafter progressing sequentially through the windows to window 210-N. It should be appreciated that this calculation order could be reversed, starting at window 210-N and ending at window 210-1. In this reversed window calculation order, the beta calculations start at the last bit position and progress sequentially down to the first bit position. Thus the beta calculations are in the correct order and do not require any initialization values, except for the last bit position which is calculated first, where this starting state may be known or may be calculated and is defined by the specific Turbo Code decoder implementation. Starting at window 210-N means that the alpha calculations window 201-N is calculated first. This results in the fact that an initialization value is used to initialize alpha calculation 201-N. It should therefore be appreciated that by reversing the window calculation order, the alpha calculations change from being calculated in sequence to being calculated in a more segmented order and the beta calculations change from being calculated in a segmented order to being calculated in the reversed sequence. The main effect of the window calculation order is to determine whether initialization values are mainly stored for the beta calculations as shown in the exemplary implementation of FIG. 2B or initialization values are mainly used for the alpha calculations by reversing the order compared to the exemplary implementation of FIG. 2B. However, for purposes of clarity and not limitation, it shall be assumed that the window calculations progress from 210-1 to 210-N In order to increase processing speed, the ordering of calculations as described with reference to FIG. 2B may be divided into two or more subparts as described with reference to FIG. 2C. FIG. 2C is a calculation flow diagram depicting an exemplary embodiment of alpha and beta calculations 230. In this particular example, a Turbo Code decoder algorithm is divided to facilitate more pipelining stages, than as described above with respect to FIGS. 2A and 2B. More particularly, a block size, which may include tail bits, is partitioned into sub-blocks, and more particularly into quarter blocks in this example, with respect to the number of bits.

Figure 5:
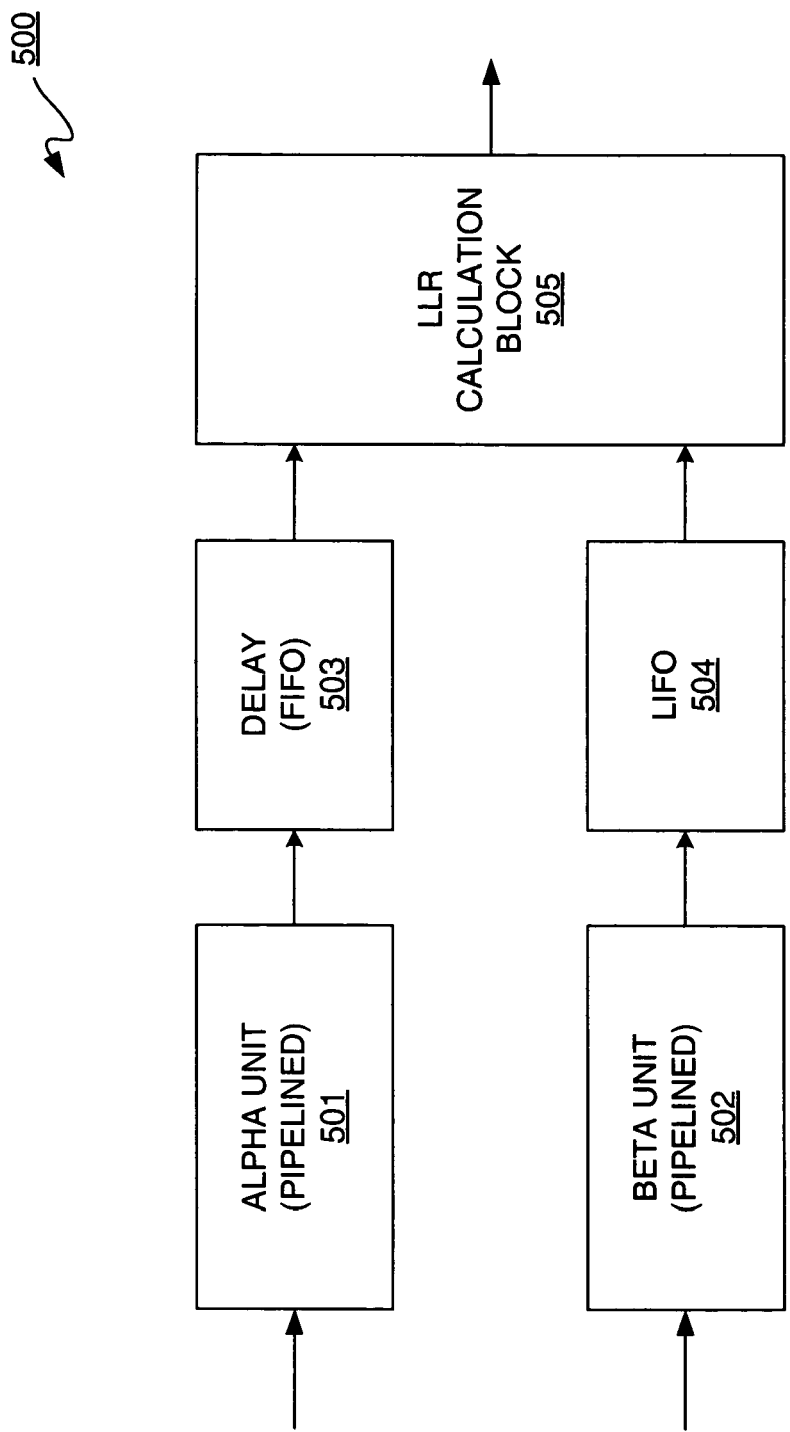
FIG. 5 is a block diagram depicting an exemplary embodiment of a decoder.

It should be understood that by dividing a block size into multiple sub-blocks for windowing, a pipeline architecture may be implemented for alpha and beta calculations. This increased pipelining can increase the speed of execution of the decoder. Continuing the above example of a 256-bit block size, each quarter block may be 64 bits long. For pipelining, it should be appreciated that at least on a first iteration, initialization values for alpha and beta calculations may be approximated Referring to FIG. 2C, alpha calculations 230-1 through 230-4 in direction 209 are used to calculate bit positions for different subsets of bits of a block. In this example, a block of bits has been divided into four subsets. In this example, for each quarter of the block size, a single window is used for each subset of alpha calculations and two windows are used for each subset of beta calculations. However, it should be appreciated that the number of windows for alpha and beta calculations may be other than those described herein as may vary from application to application depending for example on the number of pipelining stages to be implemented. Furthermore, it should be understood that an alpha unit used for alpha calculations is separate from a beta unit used for beta calculations as indicated in FIG. 5, and thus the number of windows used for alpha and beta calculations may be distinct.

In this example, alpha calculations 230-1 start with bit position 1, and then sequentially proceed, for example to bit position 2, 3, 4, . . . 64. However, as illustratively indicated, probability associated with bit position 2 of alpha calculations 230-1 is not calculated until the fifth alpha calculation. This is because a probability for bit position 65 is done on a second alpha calculation in alpha calculations 230-2. Furthermore, the third alpha calculation is calculated in alpha calculations 230-3, and the fourth alpha calculation is calculated in alpha calculations 230-4. After the fourth alpha calculation in this example, the pipeline wraps back to alpha calculations 230-1 to for the fifth alpha calculation which is for bit position 2. Thus, the subsets are generated as a division of bits, and even though the bit positions remain in sequential order, the calculation order for probability of states of bit positions moves sequentially from window to window with each alpha calculation, wrapping back to a first window after each fourth alpha calculation.

Accordingly, in this example, it should be understood that four pipeline stages may be implemented corresponding to sets of alpha calculations 230-1 through 230-4. Alpha calculations 230-1 process bit positions 1 through 64 corresponding to alpha calculations 1, 5, . . . , 253; alpha calculations 230-2 process bit positions 65 through 128 corresponding to alpha calculations 2, 6, . . . , 254; alpha calculations 230-3 process bit positions 129 through 192 corresponding to alpha calculations 3, 7, . . . , 255; and alpha calculations 230-4 process bit positions 193 through 256 corresponding to alpha calculations 4, 8, . . . , 256. Notably, the first bit may actually be bit 0, and thus the last bit may be bit 255 in this example; however, numbering starting at 1 is used for purposes of clarity and not limitation. Thus, it should be appreciated that one alpha calculation from each quarter block, namely from each window, may be calculated on each successive clock cycle. Thus, bit position 1 for alpha calculations 230-1 is calculated followed by bit position 65 for alpha calculations 230-2, and so on. For alpha calculation 1, an initialization value, such as a starting value to ensure state zero, may be used for alpha calculations 230-1. For alpha calculation 2, an initialization value may be used. Notably, the alpha calculation for bit position 64 is not done by the time of alpha calculation 2 for bit position 65, and thus an initialization value may be used for alpha calculations 230-2. Accordingly, there are two more initialization values, namely one for alpha calculation 3 of alpha calculations 230-3 and one for alpha calculation 4 of alpha calculations 230-4. Notably, in this example, only four alpha initialization values may be used, as alpha initialization values are calculated for a larger range of bit positions. In other words, by calculating alpha initialization values over one quarter of a block size, for example 64 bits as described, bit positions for alpha calculations may for example span a larger range of bit positions than a conventional window. Accordingly, initialization values may be more accurate owing to a larger sampling range.

Beta calculations 233-1 through 233-8, each of which is in direction 208, may be done in separate windows. Thus, for example, beta calculations 233-1 are for a first set of beta calculations may be done in one window, and beta calculations 233-2 are for a second set of beta calculations may be done in another window. In short, a block of bits has been divided into four subsets, and each of these subsets is subdivided by processing windows.

More particularly, half the bit positions used in alpha calculation 230-1 are used in beta calculation 233-1, and the other half of such bits used in alpha calculation 230-1 are processed in beta calculation 233-2. So, for example, a first beta calculation is done in a window for beta calculations

233-1 at a 32nd bit position. The initial initialization value for a first iteration of such first beta calculation may be for a zero state. The fifth beta calculation is done in a window for beta calculations 233-1 at the 31st bit position. In a second window corresponding to beta calculations 233-2, the 125th beta calculation is done for the 64th bit position, and an initialization value may be used for this calculation. Table I below lists beta calculation order for corresponding bit positions and associated windows for the example of FIG. 2C.

TABLE I

| Window (Set of Beta Calculations) | Processing Order of Bit Positions | Beta Calculation Order Numbers |
|---|---|---|
| 233-1 | 32 to 1 | 1, 5, . . . , 121 |
| 233-2 | 64 to 33 | 125, 129, . . . , 253 |
| 233-3 | 96 to 65 | 2, 6, . . . , 122 |
| 233-4 | 128 to 97 | 126, 130, . . . , 254 |
| 233-5 | 160 to 129 | 3, 7, . . . , 123 |
| 233-6 | 192 to 161 | 127, 131, . . . , 255 |
| 233-7 | 224 to 193 | 4, 8, . . . , 124 |
| 233-8 | 256 to 225 | 128, 132, . . . , 256 |

Because calculations in each quarter block are revisited every four clock cycles, four levels of pipelining may be incorporated into an Add-Compare-Select-Offset ("ACSO") unit or an Add-Compare-Select ("ACS") unit, in comparison for example to using one level of pipelining. Notably, this division of a block size into sub-block sizes, such as for pipelining, may be implemented into Turbo Code decoder blocks, as described below in additional detail. It should be appreciated that by having additional pipelining registers incorporated into an implementation of a Turbo Code decoder algorithm, speed of execution may be increased.

Beta calculations need not be divided as described in the example of FIG. 2C. Thus, for example, a single window may be used for four sets of beta calculations. However, by using windows for beta calculations memory storage may be reduced. Notably, for an LLR calculation block beta and alpha calculations for each same bit position are used. Thus, in the example of FIG. 2C, a first bit position probability is done on a first alpha calculation and a 121st beta calculation. Thus, the amount of data stored for LLR calculations may be reduced in contrast for example to using a single window for each set of beta calculations corresponding to a single window of each set of alpha calculations. If such corresponding single windows were used where the first beta calculation of each set thereof started at the extreme right of the associated bit positions, then in a first window the first bit position would be calculated on the first alpha calculation but not be calculated until the 253rd beta calculation, meaning more storage would be implemented to support an LLR calculation due to a larger number of cycles before alpha and beta calculations would have overlapping bit positions.

Notably, even though beta calculations are subdivided into windows, careful algorithm sequencing can reduce the number of initialization values used. Reducing the number of initialization values reduces the number stored and also enhances decoder performance. Only one initialization value for each pair may be estimated, while the other initialization value is calculated. For example, an initialization value for an initial beta calculation of each of beta calculations 233-1, 233-3, 233-5, and 233-7 may be used; however, the last value of each of beta calculations 233-3, 233-5, and 233-7 may be respectively used as the initialization value of each of beta calculations 233-2, 233-4, and 233-6. For example, the value for bit position 65 is calculated at approximately the 122nd beta calculation cycle, and bit position 64 is not calculated until approximately the 125th beta calculation cycle. Accordingly, the value of the 65th bit position of beta calculations 233-3 is available as an initialization value for the 64th bit position of beta calculations 233-2 within a same beta calculation iteration.

In the example of FIG. 2C it should be noted that more beta initialization values are generally used compared to alpha initialization values. Splitting the block into quarters may result in having four alpha initialization values and the one associated with the first bit position may be known or may be calculated depending on the specific version of the Turbo Code decoder implementation. However, as the block sizes increase, and keeping a window size of 32 for example, the number of beta initialization values may increase. It should therefore be noted that it may be possible to use smaller memory storage for the alpha initialization values compared to the beta initialization values. Consequently, it may be possible to use distributed memory, such as look up tables in an FPGA, to store initialization values in these implementations.

Figure 3A:
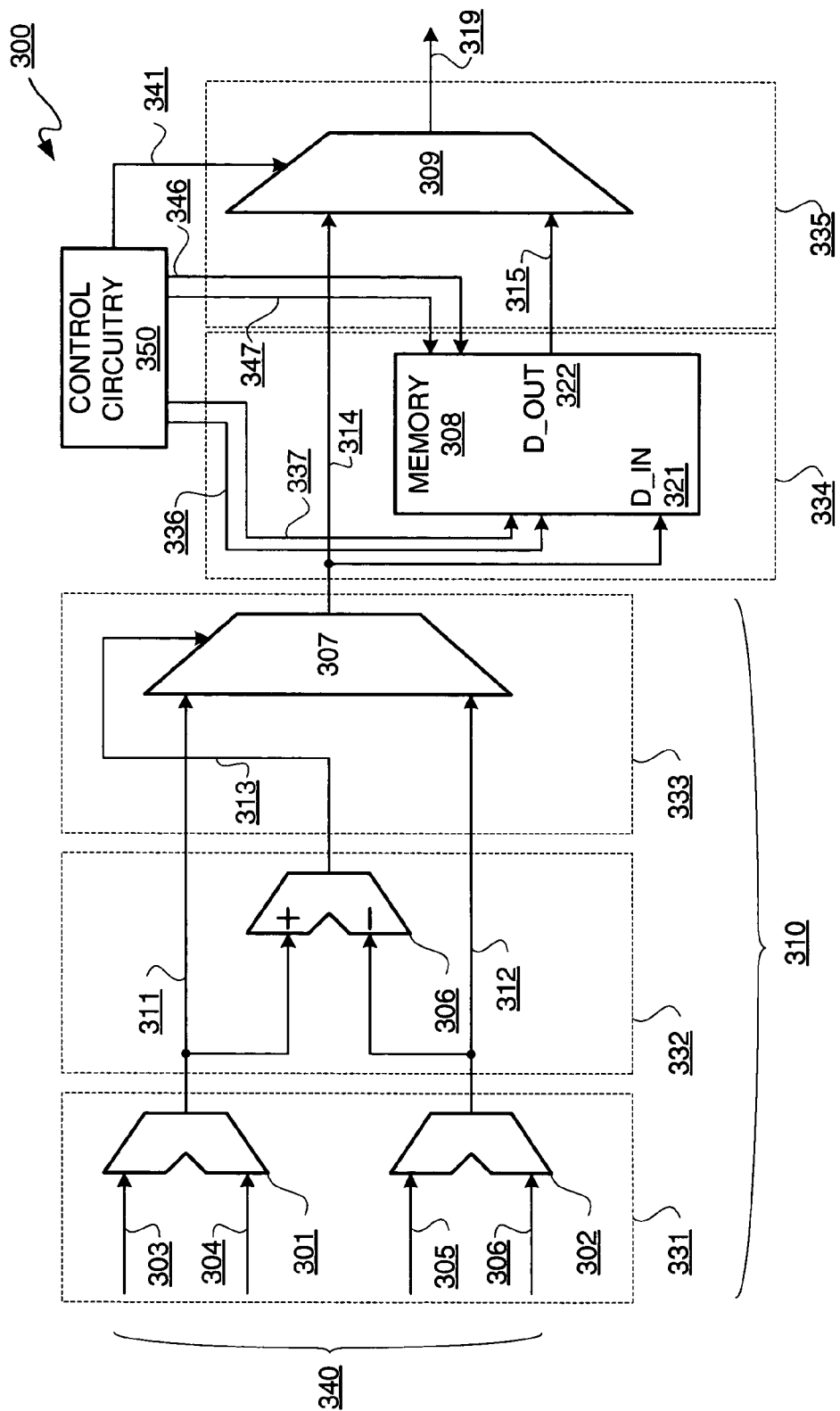
FIG. 3A is a block/schematic diagram depicting an exemplary embodiment of a decoder block.

FIG. 3A is a block/schematic diagram depicting an exemplary embodiment of a decoder block 300. Notably, decoder block 300 may be part of a Turbo Code decoder or other known type of decoder.

Turbo Code decoder block 300 includes an add stage 331, a compare stage 332, a first select stage 333, an initialization stage 334, and a second select stage 335. Notably, initialization stage 334 and select stage 335 may be controlled by control circuitry 350 of Turbo Code decoder block 300. Furthermore, it may be noted that add stage 331, compare stage 332, and first select stage 333, in combination, provide an ACS unit 310.

Referring to add stage 331, inputs 340 are provided to adders, such as adders 301 and 302. Inputs 340 may include at least one branch metric and more than one state metric. Generally, a state metric and a branch metric are provided via inputs 303 and 304 respectively to an upper adder 301, and another state metric and another branch metric are provided via inputs 305 and 306 respectively to lower adder 302. However, a branch metric may be common as applied to adders 301 and 302, and thus inputs 304 and 306 may be the same, such as for a 3GPP Turbo Code decoder implementation in which embodiment one of adders 301 and 302 may be a subtractor for efficiency.

Output of the addition of a branch metric and a state metric provided from upper adder 301 is output metric 311. Output of a branch metric and a state metric provided from adder 302 is output metric 312.

Referring to compare stage 332, subtractor 306 is coupled to receive output metrics 311 and 312. More particularly, output metric 311 is provided to a plus port of subtractor 306, and output metric 312 is provided to a minus port of subtractor 306. Accordingly, output of subtractor 306 is a difference output ("difference") 313. In other words, output of subtractor 306 is the difference between output metrics 311 and 312. Difference 313 may indicate either a positive or a negative value. In this particular example, it shall be assumed that for the condition where output metrics 311 and 312 are equal, difference 313 shall be considered a negative value.

Referring to first select stage 333, a select circuit, such as multiplexer 307, is coupled to receive output metric 311 and output metric 312 as data inputs. Additionally, multiplexer 307 is coupled to receive difference 313 as a control select input. Thus, for example, if difference 313 indicates a positive value, multiplexer 307 provides output metric 311 as output metric 314. If, however, difference 313 indicates a negative value, then multiplexer 307 provides output metric 312 as output metric 314. However, if output metrics 311 and 312 are equal, either may be output from multiplexer 307.

With reference to ACS unit 310, it should be appreciated that generally two pairs of numbers are first added. The sums of the additions are compared, with the larger of the two sums being selected for output. Notably, it is not necessary that the larger of the two sums be output, as the smaller of the two sums may be output for a Viterbi decoder. Thus, it should be appreciated that other known types of decoders configured to decode data that has been convolutionally encoded where initialization values are used for the decoding may employ decoder block 300. However, for purposes of clarity by way of example and not limitation, it shall be assumed that decoder block 300 is for a Turbo Code decoder.

Referring to initialization stage 334, memory 308 is coupled to control circuitry 350 and to multiplexer 307 to receive output metric 314 of first select stage 333. Control circuitry 350 may include counters and receive clock signaling for tracking bit position within alpha and beta calculations, within a window, and within a block size. For example, control circuitry 350 may track where within a block size and where within a window data being processed by Turbo Code decoder block 300 is with respect to initialization stage 334, and second select stage 335. If output metric 314 of multiplexer 307 is for a non-initialization value, then control circuitry 350 provides select signal 341 to multiplexer 309 of second select stage such that output metric 314 is selected as output data 319 from multiplexer 309. Output data 319 may be either alpha calculation data or beta calculation data, as separate ACS units may be used for alpha calculations and beta calculations, as described below in additional detail.

If, however, output metric 314 of multiplexer 307 is for an initialization value, then control circuitry 350 asserts a read enable signal 347 and an address signal 346 as coupled to memory 308. Responsive to read enable signal 347 and address signal 346, memory 308 obtains data associated with an address of address signal 346 and provides such data via data output port 322 of memory 308 as an initialization value 315 to multiplexer 309. Additionally, control circuitry 350 asserts control select signal 341 such that output 315 is selected as output data 319 from multiplexer 309.

Furthermore, for output metric 314 being an initialization value, such initialization value is input via data input port 321 and stored in memory 308. Accordingly, control circuitry 350 responsive to a location in a window within a block, asserts an address on address signal 336 and write enable signal 337 as coupled to memory 308 for writing of a value associated with output 314 to memory 308 at the address indicated by address signal 336.

Accordingly, it should be appreciated that initialization values are written to and read from memory 308. Memory 308 may be a random access memory ("RAM"). It should be appreciated that memory 308 may be a dual ported memory for reading and writing at the same or at least substantially the same time.

In addition to calculated values from ACS unit 310 stored in memory 308 to form initialization values for later, memory 308 may be used to store specific "hard" values. For example, memory 308 may contain a high probability to ensure a state zero for an initialization of a first calculation, such as a first alpha calculation in this example. Furthermore, equally likely state values, implying that there is no state information, may be ensured with initialization values for a first iteration of beta calculations or a portion of beta calculations not having calculated initialization values available. Such hard values may be selected responsive to addressing and read enabling of memory 308. As previously described, to support a Turbo Code decode algorithm as associated with Turbo Code decoder block 300, multiple ACS units 310 may be coupled in parallel along with associated initialization stage 334 and second select stage 335. Continuing the example of using eight states, there may be eight ACS units 310 coupled in parallel for an alpha unit and another eight ACS units 310 coupled in parallel for a beta unit as described below in additional detail.

Notably, memory 308 may include a BRAM 103 of FPGA 100 of FIG. 1. Furthermore, ACS unit 310 and multiplexer 309, as well as control circuitry 350, may be implemented in programmable logic such as by using CLBs 102 of FPGA 100 of FIG. 1. Notably, by having memory 308 in combination with control circuitry 350 for facilitating selection as between initialization and non-initialization values for output from multiplexer 309, a third select stage may be avoided.

Figure 3B:
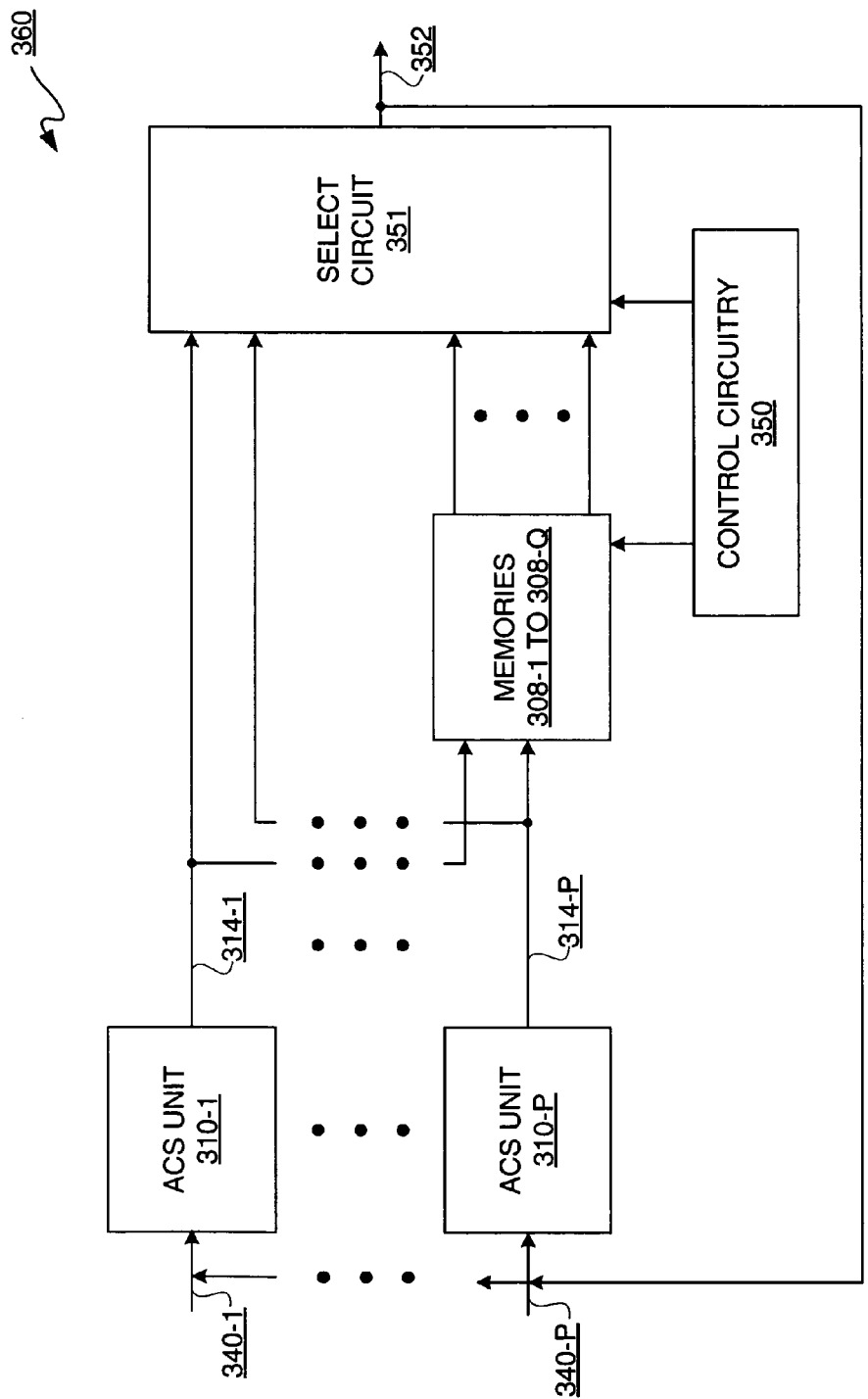
FIG. 3B is a block diagram depicting an exemplary embodiment of a decoder processing block.

FIG. 3B is a block diagram depicting an exemplary embodiment of a decoder processing block 360. Processing block 360 may be an alpha unit or a beta unit. Processing block 360 may include ACS units 310-1 through 310-P, for P a positive integer greater than one. Accordingly, input sets 340-1 through 340-P may be respectively provided to ACS units 310-1 through 310-P. Notably, the value of P may be, though need not be, equal to the number of states. However, continuing the prior example, if it is assumed that there are eight states, then the value of P may be eight.

ACS units 310-1 through 310-P provide respective outputs 314-1 through 314-P. Outputs 314-1 through 314-P are provided to memory spaces ("memories") 308-1 to 308-Q, for Q a positive integer greater than 1, as well as to select circuit 351. Notably, a single memory or multiple memories may be used, as shall become more apparent from the following description. Furthermore, Q may be, but need not be, equal to P.

Select circuit 351 and memories 308-1 to 308-Q are controlled by control circuitry 350. Notably, select circuit 351 may in effect be a large multiplexer. At specific times in the processing in accordance with a Turbo Code decode algorithm, each ACS unit 310 may have initialization data which is to be stored in memories 308-1 through 308-Q.

Because some memories, such as BRAMs 103 of FIG. 1, have multiple write enable ports for each data input port, Q may be less than P. Accordingly, continuing the above example, for four write enable ports for each data input port, two BRAMs may be used to support eight ACS units 310. Notably, initialization values stored in memories 308-1 through 308-Q may be read for input to and output from select circuit 351. Thus, at specific times processing block 360 reads initialization values from memories 308-1 to 308-Q for output from select circuit 351 as output data 352. Again, there may be a single memory rather than multiple memories 308-1 to 308-Q, depending on how many ACS units 310-1 through 310-P are implemented for a processing block 360.

Notably, output data 352 may be fed back to provide a portion of input sets 340-1 through 340-P. Referring back to FIG. 3A, for inputs 303 and 306 being state values, these inputs may be obtained from output data 352. Thus, for example, where a next calculation, such as a next alpha or beta calculation, depends on a prior calculation, feedback of output data 352 may be used to provide the prior calculation for the next calculation.

Figure 4A:
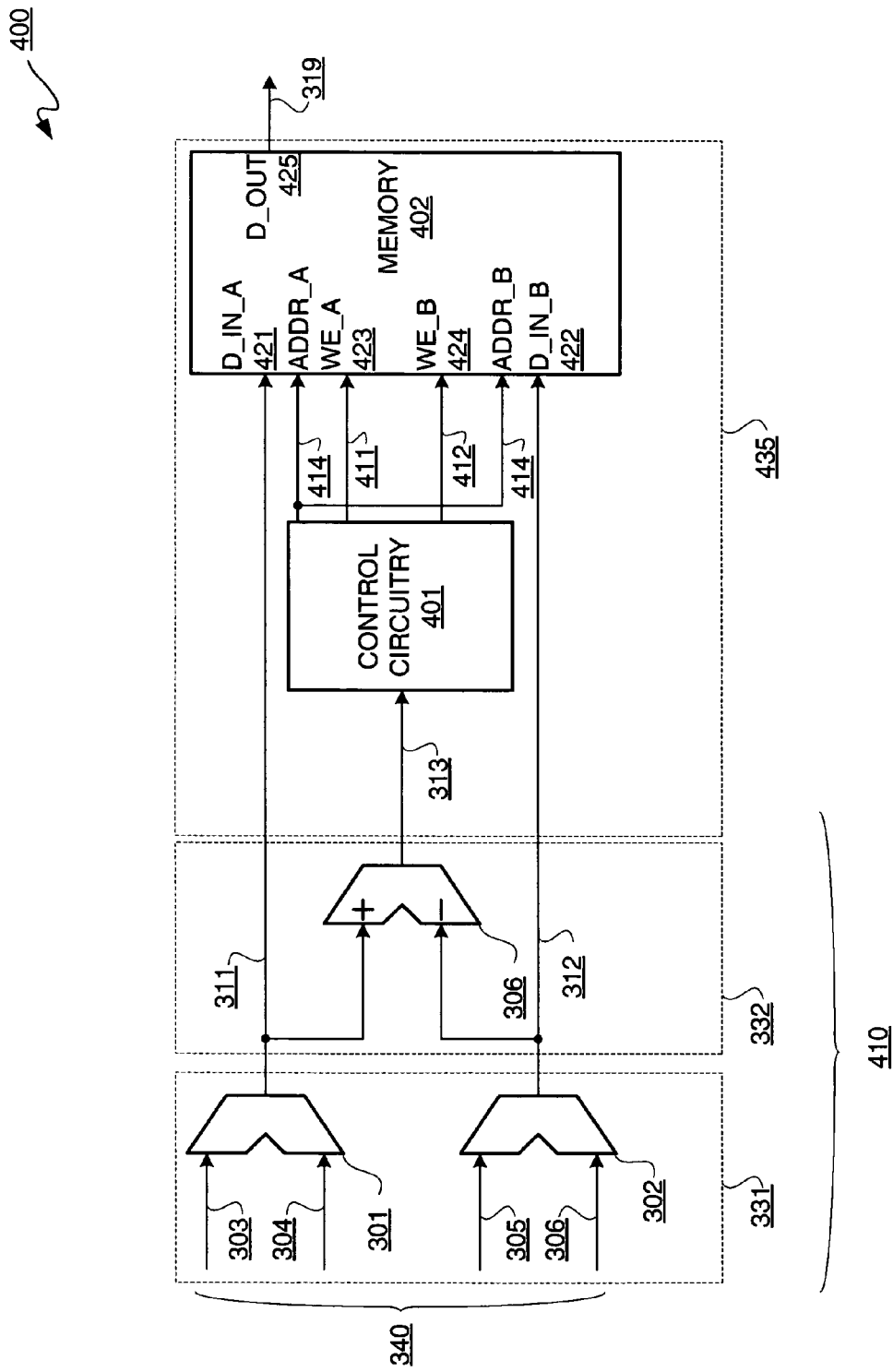
FIG. 4A is a block/schematic diagram depicting an alternative exemplary embodiment of the decoder block of FIG. 3A.

FIG. 4A is a block/schematic diagram depicting an alternative exemplary embodiment of decoder block 300 of FIG. 3A, namely decoder block 400. Stages 331 and 332 have been previously described with reference to FIG. 3A, and thus that prior description is not repeated. Coupled to stages 331 and 332 is initialization/select stage 435.

Output metric 311 and output metric 312 are provided to respective data input ports 421 and 422, generally data input port A and data input port B respectively, of memory 402. As shall become more apparent, it should be understood that stages 331 and 332, in combination, provide an add-compare ("AC") unit 410.

Output of subtractor 306, namely difference 313, is provided as an input to control circuitry 401. Control circuitry 401 may be similar to control circuitry 350 of decoder 300 of FIG. 3, in that counters may be used such that a stage of data processing within decoder block 400 is known with respect to where in a window, for example, such data is being processed. For difference 313 indicating a positive value, control circuitry 401 may assert a write enable signal 411 provided to a write enable port A 423 used to control input via data input port A 421 of memory 402. Control circuitry 401 may provide an address via address signal 414 to an address port of memory 402 for writing output metric 311 to such address in memory 402.

If, however, difference 313 has a negative value, control circuitry 401 may assert write enable signal 412 for write enable port B 424 of memory 402. If write enable signal 412 is asserted, then output metric 312 provided to data input port B 422 of memory 402 may be written to an address in memory 402 as associated with address signal 414. A same address provided via address signals 414 may be used for both ports A and B of memory 402 with respect to data that is not initialization data and provided that memory 402 is configured in a read first mode. In other words, data at an address associated with address 414 is read out of data output port 425 to provide output data 319 prior to writing such data to such an address. Accordingly, control circuitry 401 may provide a read enable signal by not asserting a write enable signal and a read address via address signal 414 to memory 402 for reading out data 319. For example, if data output port A is used, then reading data is associated with non-assertion of write enable A and an address for port A. Thus, data may be read out from an address location prior to new data being written to such an address location in memory 402.

If, however, either output metric 311 or 312 is initialization data, then either write enable signal 411 for data provided to data input port A 421 or write enable signal 412 for data provided to data input port B 422 may be asserted for writing such initialization data to a different address than the address used for non-initialization data. Notably, more address space may be used for initialization data than non-initialization data.

For a read of initialization data, the address provided via address signal 422 may point to one of the initialization addresses in memory 402, and control circuitry may assert a read enable signal by not asserting a write enable signal provided to memory 402 for reading out initialization data from data output port 425 to provide output data 319.

Thus, it should be understood that decoder block 400 may be a reduction in circuitry over decoder block 300, with respect to implementation in an FPGA as described with reference to FIG. 1. By using the dual ported configuration of memory 402, multiplexers 307 and 309 of FIG. 3A may be avoided. Rather, initialization values may be directly written into and read out of memory 402 along with non-initialization values. This may be done by using separate write enable signals respectively associated with data input ports A and B, the selection of which may be controlled in part by the output of subtractor 306, namely difference 313. Furthermore, by providing the same address to both address ports A and B, it is ensured that the value written into memory 402 is written into the correct location.

With continued reference to FIG. 4A and renewed reference to FIG. 3A, differences in operation between decoder blocks 400 and 300 are described in additional detail. For a non-initialization operation in decoder block 400, namely an operation in which a maximum value number may be selected, memory addresses for address ports A and B of memory 402 may be held constant, at a predetermined address. In this configuration, memory 402 may have approximately a one to two cycle delay with respect to propagating data through decoder block 400. When initialization values are to be stored in memory 402, the address provided to an address port, whether it be address port A or B, is changed to point to an address in address space associated with storing initialization values.

Decoder block 400 may be delayed when initialization data is written to memory 402. In other words, when initialization data is written, data output may not be valid. Accordingly, if such data is invalid, feeding such output data back, such as output data 352 of FIG. 3B, does not further pipeline processing. Thus, some delay or cycle latency may be incurred. For example, there may be approximately one additional cycle of delay for each initialization value written to memory 402 to allow for a pipeline reload of data.

In contrast, decoder block 300 allows initialization values in a more parallel manner. More particularly, a pipeline of decoder block 300 may be less subject to pipeline reload latency than a pipeline of decoder block 400. Thus, there may be a trade-off between using decoder blocks 300 and 400, namely decoder block 300 may have less additional latency in contrast to decoder block 400. However, decoder block 400 for a modicum of additional latency may be a significant reduction in circuitry size in comparison to decoder block 300. Notably, for the example of a window size of 32 bits, the additional latency happens only once every 32 cycles.

Figure 4B:
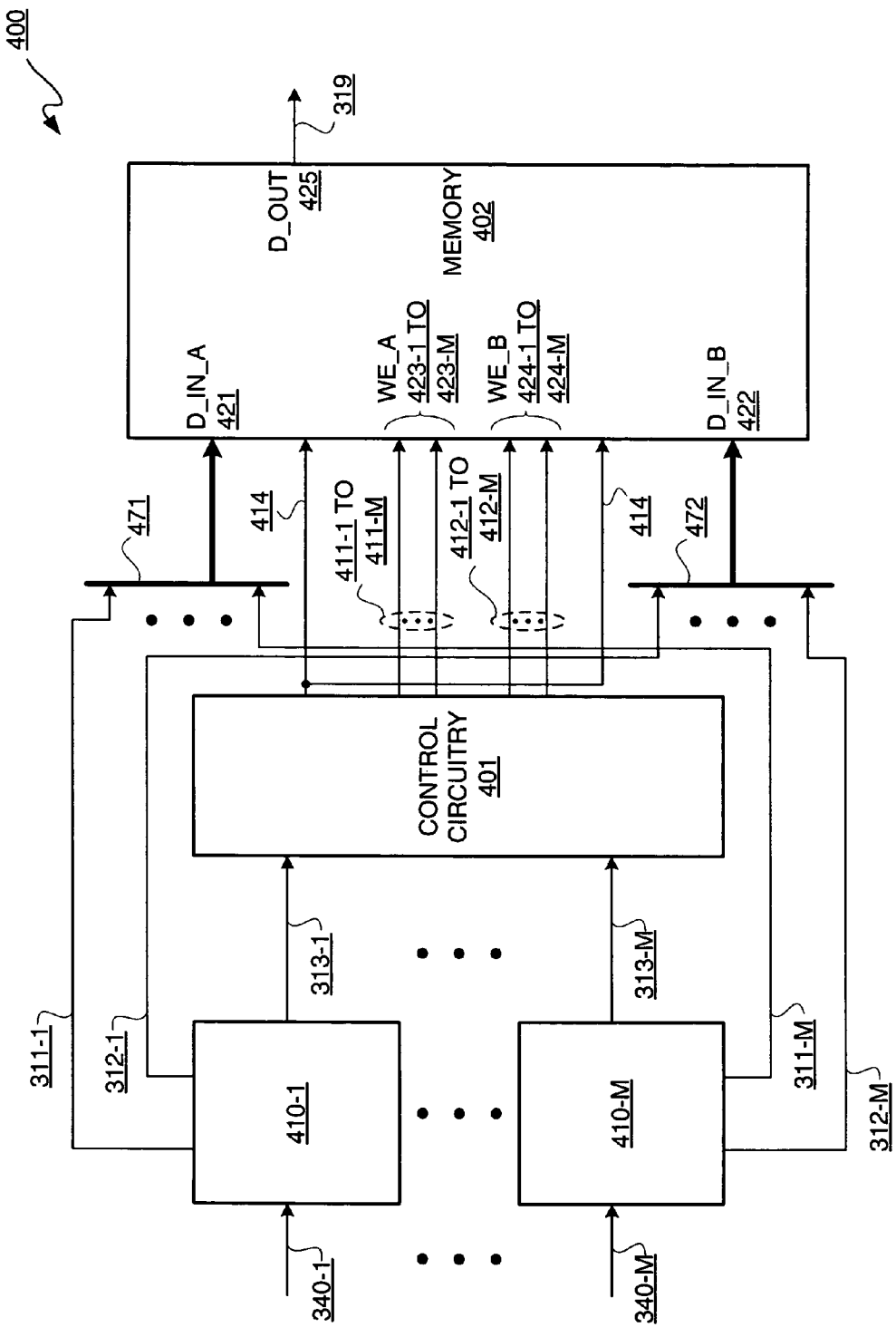
FIG. 4B is a block diagram depicting an exemplary embodiment of an implementation of the decoder block of FIG. 4A.

FIG. 4B is a block diagram depicting an exemplary embodiment of an implementation of decoder block 400 for M add-compare ("AC") units 410, for M a positive integer greater than one. In this particular example, memory 402 has four write enable ports for each data input port. Accordingly, for this example, it shall be assumed that M is equal to four. However, it shall be appreciated that M may vary as the number of write enable ports for each data input port varies.

For input sets 340-1 through 340-M, respectively, to AC units 410-1 through 410-M, there are difference outputs 313-1 through 313-M. Additionally, from AC units 410-1 through 410-M there are respective output metrics 311-1 through 311-M and output metrics 312-1 through 312-M. M output metrics 311-1 through 311-M (collectively, "output metrics 311") may be combined to provide a 36-bit wide input to data input port A 421 as generally indicated by bus 471, and M output metrics 312-1 through 312-M (collectively, "output metrics 312") may be combined to provide a 36-bit wide input to data input port B 422, as generally indicated by bus 472. Thus, for example, assuming that data input port A 421 and data input port B 422 are 36-bit wide ports, then for M equal to four, each output metric of output metrics 311 and 312 may be nine bits wide.

Control circuitry 401 is coupled to received differences 313-1 through 313-M. Differences 313-1 through 313-M may be used to identify which of output metrics 311 are to be selected, if any, and which output metrics 312 are to be selected, if any, for writing to memory 402.

For example, if the value of output metric 311-1 was greater than the value of output metric 312-1, output metric 311-1 would be selected for writing to memory 402 as indicated by difference 313-1 being positive. In this example, write enable port A 423-1 of write enable ports A 423-1 through 423-M would receive a write enable signal 411-1 of write enable signals 411-1 through 411-M for writing the nine bits associated with output metric 311-1 to memory 402 via data input port A 421. Accordingly, control circuitry 401 may be configured to provide sets of write enable signals 411-1 through 411-M and 412-1 through 412-M. Write enable signals 411-1 through 411-M (collectively, "write enable signals 411") may be provided to respective write enable ports A 423-1 through 423-M (collectively, "write enable ports A 423") as associated with data input port A 421, and write enable signals 412-1 through 412-M (collectively, "write enable signals 412") may be provided to respective write enable ports B 424-1 to 424-M (collectively, "write enable ports B 424") as associated with data input port B 422. Address signal 414 may be provided to both address ports A and B of memory 402, as previously described.

Accordingly, it should be appreciated that a portion of output metrics 311 and a portion of output metrics 312 may be selected at a time for being written to an address location in memory 402 associated with address signal 414. Thus, by configuring memory 402 in a read first mode, output such as obtained from data output port 425, may be read from an address associated with address signal 414 prior to writing data to such address.

After reading data, the portion of data selected for writing into data input port A 421 and the portion of data selected for writing into data input port B 422 may be written to such address location, where such portions to be written are respectively associated with a portion of write enable ports A 423 and a portion of write enable ports B 424. Thus, for example, suppose the first ("top") 18 bits of 36 bits provided to data input port A 421 are selected for being written into memory 402 and the last ("bottom")18 bits of 36 bits are not, and conversely suppose the bottom 18 bits provided to data input port B 422 are selected for being written into memory 402 and the top 18 bits are not. In this example, write enable signals 411-1 and 411-2 would be asserted and write enable signals 411-3 and 411-4, for M equal to four, would not be asserted. Furthermore, write enable signals 412-1 and 412-2 would not be asserted, and write enable signals 412-3 and 412-4 would be asserted.

Thus, data written to an address in memory 402 as associated with address signal 414 may be written where the first 18 bits are obtained from data input port A 421 and the next 18 bits are obtained from data input port B 422 to provide a concatenation of 36 bits written into an address space in memory 402. Thus, it should be appreciated that a BRAM 103 of FIG. 1 may support four AC units 410. By using two decoder blocks 400 as configured in the implementation of FIG. 4B, eight ACS stages may be supported for providing data output 319 in two halves. Again, for eight states, there may be eight AC units 410 for each alpha and beta unit of FIG. 5 to provide for parallel processing to reduce processing time.

FIG. 5 is a block diagram depicting an exemplary embodiment of a decoder 500. Decoder 500 includes alpha unit 501, beta unit 502, delay 503, last-in/first-out buffer ("LIFO") 504, and LLR calculation block 505. Alpha unit 501 may include multiple Turbo Code decoder blocks 300 or 400. Optionally, these decoder blocks may be pipelined depending on whether a block size has been divided into sub-blocks, as previously described. The number of AC/ACS stages in alpha unit 501 and beta unit 502 accordingly may depend on the number of sub-blocks.

Beta unit 502, like alpha unit 501, may include a number of decoder blocks 300 or 400, and these decoder blocks 300 or 400 may optionally be pipelined. Notably, the number of decoder blocks in each of alpha unit 501 and beta unit 502 may also depend upon the number of states to be processed. In the following example, an eight-state 3GPP implementation is described; however, fewer or more than eight states may be implemented. Generally the number of states is a number that is evenly divisible by two or some other positive power of two number. Thus, it should be appreciated that a series of sets of data, such as alpha calculation data of output data 319 of FIGS. 3 and 4, are provided from alpha unit 501 to a delay 503, representing results of alpha calculations.

Delay 503 may be implemented as a first-in/first-out buffer ("FIFO"). Beta unit 502 may output a series of output data, such as beta calculation data, via output data 319 of FIGS. 3 and 4. This output may be provided to LIFO 504. Again, it should be understood that beta calculations are the reverse direction of alpha calculations, and thus the direction of either results from alpha or beta calculations is reversed prior to combining alpha and beta calculation results. Thus, LIFO 504, which may be implemented using RAM, such as a BRAM 103 of FIG. 1, may be implemented to reverse the order of beta calculations in this example. Alternatively, LIFO 504 and delay 503 may be switched such that LIFO 504 is for alpha calculations and delay 503 is for beta calculations.

To compensate for delay associated with LIFO 504, delay 503 may be implemented. Notably, delay 503, such as a FIFO, may be avoided, as start times of calculations may be adjusted such that no separate delay need be implemented. Alpha calculations obtained from delay 503 and beta calculations obtained LIFO 504 are provided to LLR calculation block 505. Alpha and beta calculations for each position in a sequence may be combined by LLR calculation block 505. Notably, decoder blocks, such as decoder blocks 300 or 400 as described herein, may be implemented in LLR calculation block 505, although initialization values do not have to be used within LLR calculation block 505. Thus, probabilities associated with each position may be combined for alpha and beta states to produce optimized or otherwise enhanced probabilities, namely to provide decoded output from Turbo Code encoded data.

Figure 6A:
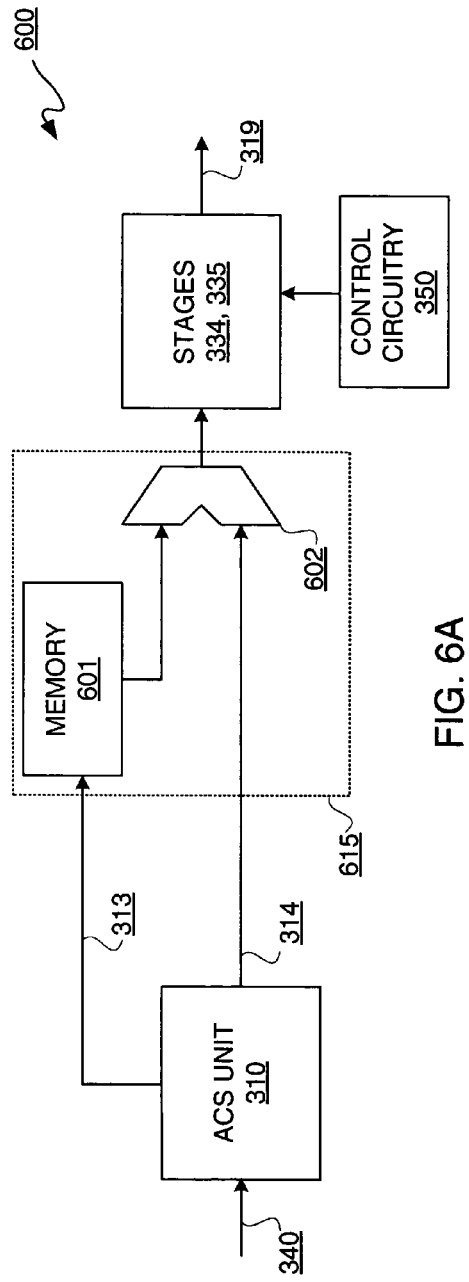
FIG. 6A is a block/schematic diagram depicting an exemplary embodiment of an Add-Compare-Select-Offset ("ACSO") unit.

In foregoing description, decoder blocks for alpha and beta units have been described without an offset stage. FIG. 6A is a block/schematic diagram depicting an exemplary embodiment of an ACSO unit 600. ACSO unit 600 includes ACS unit 310, an offset stage 615, stages 334 and 335, and control circuitry 350. Offset stage 615 includes memory 601 and adder 602.

As previously described with respect to FIG. 3A, ACS unit 310 receives input metrics 340 and provides output metric 314, as well as a difference 313. Difference 313 may be provided to a memory 601. Memory 601 may be a read only memory, or other known memory for storing offset information. For purposes of clarity, it shall be assumed that memory 601 includes control circuitry for controlling operation of memory 601 for responding to receiving difference 313. Output of memory 601 responsive to difference 313 may be an offset, which is provided as an input to adder 602. Adder 602 receives output metric 314 for addition with the offset information obtained from memory 601 to provide an output to stages 334 and 335, for processing as previously described with respect to FIG. 3A.

Figure 6B:
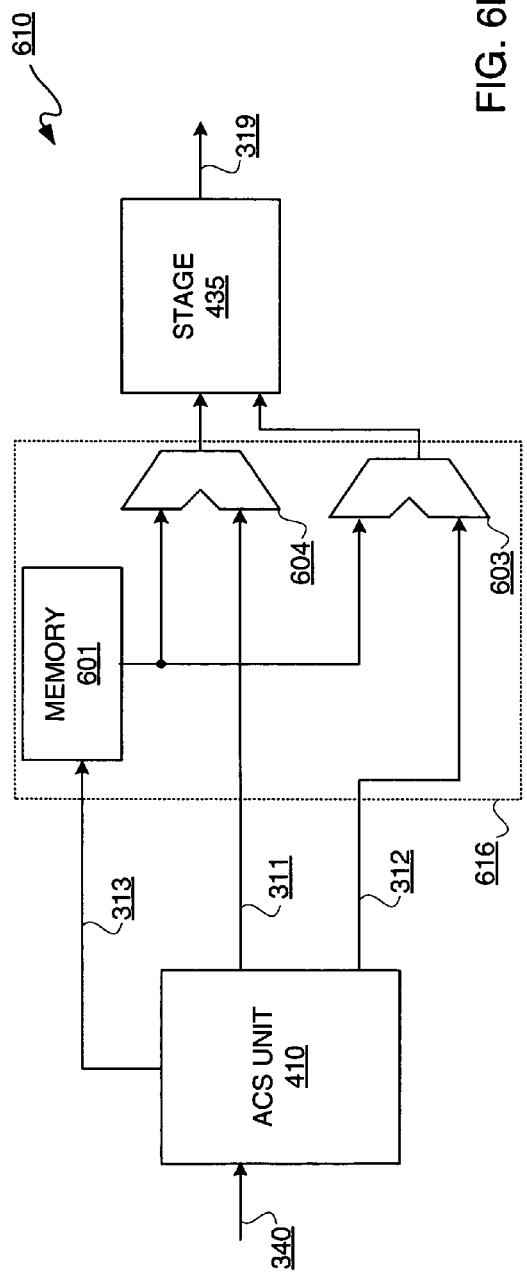
FIG. 6B is a block/schematic diagram depicting an exemplary embodiment of a decoder block with offset.

FIG. 6B is a block/schematic diagram depicting an exemplary embodiment of a decoder block 610 with offset.

Decoder block 610 with offset includes AC unit 410, an offset stage 616, and stage 435. Offset stage 616 includes memory 601 and adders 603 and 604.

As previously described with respect to FIG. 4A, AC unit 410 receives input metric 340 and provides output metrics 311 and 312, as well as difference 313. Difference 313 may be provided to memory 601 for providing offset information, as described with reference to FIG. 6A. The offset information may be provided as inputs to adders 603 and 604. Adder 604, in addition to receiving offset information from memory 601, receives output metric 311. The output of adder 604 may be provided to stage 435 for processing as previously described with reference to FIG. 4A. Additionally, output metric 312 is provided as an input to adder 603 along with offset information from memory 601. The output of adder 603 may be provided as another input to stage 435 for processing as previously described.

With reference to FIGS. 6A and 6B, it should be appreciated that even though a single stage of each of ACSO unit 600 and decoder block 610 with offset is illustratively shown, multiple stages may be implemented in accordance with the prior description. Furthermore, such multiple stages may be pipelined, as previously described.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A decoder, comprising:
   an add stage configured to provide outputs;
   a compare stage coupled to the add stage to receive the outputs therefrom, the compare stage configured to determine a difference between a pair of the outputs;
   a first select stage coupled to the compare stage and the add stage, the first select stage configured to select a first output from the pair of the outputs from the add stage responsive to the difference from the compare stage;
   an initialization stage coupled to receive the first output selected from the first select stage, the initialization stage configured to store the first output as an initialization value;
   a second select stage coupled to receive the first output selected from the first select stage and coupled to obtain the initialization value stored from the initialization stage, the second select stage configured to output either the first output selected from the first select stage or the initialization value from the initialization stage as a second output;
   control circuitry coupled to the initialization stage and the second select stage, the control circuitry configured to control storing the initialization value in the initialization stage and to retrieve the initialization value from the initialization stage for the second select stage, the control circuitry further configured to cause the second select stage to select either the first output selected from the first select stage or the initialization value from the initialization stage as the second output; and
   the initialization stage in combination with the control circuitry facilitating selection between initialization and non-initialization values for providing the second output from the second select stage.

2. The decoder according to claim 1, wherein the initialization stage in combination with the control circuitry avoids inclusion of a third select stage.

3. The decoder according to claim 1, wherein the first output selected is a larger one of the outputs for Turbo Code decoding.

4. The decoder according to claim 1, wherein the initialization stage includes a dual ported random access memory.

5. The decoder according to claim 1, further comprising an offset stage coupled to receive input from the compare stage and the first select stage and configured to provide the first output selected with an offset value to the initialization stage and the second select stage, the offset value being obtained responsive to the difference.

6. A decoder, comprising:
   an add stage configured to provide outputs;
   a compare stage coupled to the add stage to receive the outputs therefrom, the compare stage configured to determine a difference between a pair of the outputs;
   control circuitry coupled to the compare stage to receive the difference, the control circuitry configured to assert either a first write activation signal or a second write activation signal responsive to the difference, wherein the control circuitry is further configured to control storing an initialization value which is a first output of the pair of the outputs that is selected based on the difference, wherein the control circuitry is also configured to cause selection of a second output from either (a) the output of the pair of the outputs that is selected based on the difference, or (b) the initialization value;
   a memory coupled to receive the outputs, a first portion of the outputs being provided to a first data input port of the memory, a second portion of the outputs being provided to a second data input port of the memory; and
   the memory coupled to receive the first write activation signal and the second write activation signal, the first write activation signal being associated with the first data input port, the second write activation signal being associated with the second data input port.

7. The decoder according to claim 6, wherein the control circuitry is configured to assert an address signal having a first address for writing to the memory.

8. The decoder according to claim 7, wherein the control circuitry is configured to assert the address signal having a second address for reading from the memory and configured to not assert either the first write activation signal or the second write activation signal for reading from the memory.

9. The decoder according to claim 8, wherein the first address and the second address are a same address space, and wherein the memory is configured in a read-first mode.

10. The decoder according to claim 7, wherein the first portion of the outputs and the second portion of the outputs are written to a same address space, the first portion and the second portion of the outputs being placed in order and concatenated in the address space.

11. A decoder, comprising:
   an alpha calculation unit for a decode algorithm;
   a beta calculation unit for the decode algorithm;
   one of the alpha calculation unit and the beta calculation unit coupled to a first buffer for reversing an order of calculation results;
   the alpha calculation unit and the beta calculation unit being coupled to a log likelihood ratio calculation block, wherein one of the alpha calculation unit and the beta calculation unit is coupled to the log likelihood ratio calculation block via the first buffer;

each of the alpha calculation unit and the beta calculation unit including a plurality of decode blocks, each of the decode blocks associated with memory coupled for storing and retrieving initialization data;

each of the alpha calculation unit and the beta calculation unit configured for processing a block size divided into subsets; and wherein the subsets are subdivided by windows and a number of the windows is based on a number of pipeline stages, and wherein a number of windows used for each of the subsets of the alpha calculation unit is different than a number of windows used for each of the subsets of the beta calculation unit, and wherein the initialization data is obtained from add-compare-select units of the decode blocks and stored in response to differences obtained from add-compare units of the add-compare-select units.

12. The decoder according to claim 11, wherein the first buffer is a last-in first out buffer.

13. The decoder according to claim 11, further comprising a second buffer coupled between the log likelihood ratio calculation block and one of the alpha calculation unit and the beta calculation unit not coupled to the first buffer.

14. The decoder according to claim 13, wherein the first buffer is a last-in first out buffer; wherein the second buffer is a first-in first-out buffer; and wherein the decode algorithm is for a Turbo Code.

15. The decoder according to claim 11, wherein the memory is random access memory coupled for the storing and the retrieving of the initialization data.

16. The decoder according to claim 11, wherein the memory is random access memory coupled for the storing and the retrieving of the initialization data, the initialization data being obtained from state and branch metrics processed by the add-compare units of the decode blocks and stored responsive to differences associated with the state and branch metrics obtained from the add-compare units.

17. The decoder according to claim 16, wherein the random access memory is block random access memory of a programmable logic device; and wherein at least the alpha calculation unit and the beta calculation unit are instantiated in programmable logic of the programmable logic device.

18. The decoder according to claim 11, wherein the decode blocks of each of the alpha calculation unit and the beta calculation unit are configured for the pipelining, the pipelining of the alpha calculations having a one-to-one correspondence between first processing windows and the subsets, the pipelining of the beta calculations having a one-to-more than one correspondence between the subsets and second processing windows.

19. The decoder according to claim 18, wherein each of the decode blocks of each of the alpha calculation unit and the beta calculation unit are associated with a state of the decode algorithm.

* * * * *